United States Patent
Nguyen et al.

(10) Patent No.: US 11,830,545 B2
(45) Date of Patent: Nov. 28, 2023

(54) DATA PROGRAMMING TECHNIQUES TO STORE MULTIPLE BITS OF DATA PER MEMORY CELL WITH HIGH RELIABILITY

(71) Applicant: Micron Technology, Inc., Boise, ID (US)

(72) Inventors: Phong Sy Nguyen, Livermore, CA (US); James Fitzpatrick, Laguna Niguel, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/124,380

(22) Filed: Dec. 16, 2020

(65) Prior Publication Data

US 2022/0189544 A1   Jun. 16, 2022

(51) Int. Cl.
| | |
|---|---|
| G11C 11/34 | (2006.01) |
| G11C 11/56 | (2006.01) |
| G11C 16/26 | (2006.01) |
| G11C 16/10 | (2006.01) |

(52) U.S. Cl.
CPC ...... *G11C 11/5628* (2013.01); *G11C 11/5642* (2013.01); *G11C 11/5671* (2013.01); *G11C 16/10* (2013.01); *G11C 16/26* (2013.01)

(58) Field of Classification Search
CPC . G11C 11/5628; G11C 16/10; G11C 11/5671; G11C 11/5642; G11C 16/26
See application file for complete search history.

(56) References Cited

U.S. PATENT DOCUMENTS

| | | |
|---|---|---|
| 9,385,896 B1 | 7/2016 | Mitra et al. |
| 2009/0241008 A1 | 9/2009 | Kim et al. |
| 2011/0066915 A1 | 3/2011 | Arye |
| 2015/0171957 A1 | 6/2015 | Featherston et al. |
| 2016/0049203 A1 | 2/2016 | Alrod et al. |
| 2016/0094247 A1 | 3/2016 | Parthasarathy et al. |
| 2018/0144786 A1 | 5/2018 | Lim et al. |

(Continued)

OTHER PUBLICATIONS

Dynamic Adjustment of Data Integrity Operations of a Memory System Based on Error Rate Classification, U.S. Appl. No. 16/807,056, filed Mar. 2, 2020, Patrick Khayat et al., Docketed New Case—Ready for Examination, Apr. 14, 2020.

(Continued)

*Primary Examiner* — Uyen Smet
(74) *Attorney, Agent, or Firm* — Greenberg Traurig

(57) ABSTRACT

A memory system to generate data with a relation among data groups for reliably storing a predetermined number of bits per memory cell in memory cells. For example, from first groups of date bits, a second group of data bits is generated. Data groups of the predetermined number is formed to have the first groups and the second group and a predetermined relation (e.g., XOR or XNOR) among the data groups. Threshold levels of memory cells in a memory cell group are determined based on a predetermined mapping, where a threshold level of each memory cell is determined to represent one bit from each of the data groups. In the predetermined mapping, bit values represented by any two successive threshold levels differ by one bit. Threshold voltages in the memory cell group are programmed according to the threshold levels to store the data groups with improved reliability.

21 Claims, 9 Drawing Sheets

(56) References Cited

U.S. PATENT DOCUMENTS

| | | |
|---|---|---|
| 2018/0240515 A1* | 8/2018 | Shibata .................. G11C 16/32 |
| 2018/0253353 A1 | 9/2018 | Takase |
| 2019/0043590 A1 | 2/2019 | Besinga et al. |
| 2019/0189228 A1 | 6/2019 | Lin et al. |
| 2019/0361769 A1 | 11/2019 | Chan et al. |
| 2019/0379404 A1 | 12/2019 | Blankenship et al. |
| 2020/0021358 A1 | 1/2020 | Maccaglia et al. |
| 2020/0293398 A1 | 9/2020 | Symons et al. |
| 2020/0303000 A1* | 9/2020 | Takahashi .............. G11C 16/26 |
| 2021/0152191 A1 | 5/2021 | Sarkis et al. |
| 2021/0158861 A1 | 5/2021 | Jeong et al. |
| 2021/0181942 A1 | 6/2021 | Fitzpatrick et al. |
| 2021/0271549 A1 | 9/2021 | Khayat et al. |

OTHER PUBLICATIONS

International Search Report and Written Opinion, PCT/US2022/036372, dated Oct. 28, 2022.

Selective and Dynamic Deployment of Error Correction Code Techniques in Integrated Circuit Memory Devices, U.S. Appl. No. 17/841,096, filed Jun. 15, 2022, James Fitzpatrick et al., Application Undergoing Preexam Processing, Jun. 15, 2022.

Dynamic Adjustment of Data Integrity Operations of a Memory System Based on Error Rate Classification, U.S. Appl. No. 16/807,056, filed Mar. 2, 2020, Patrick Khayat et al., Non Final Action dated Jul. 28, 2022.

\* cited by examiner

DATA PROGRAMMING TECHNIQUES TO STORE MULTIPLE BITS OF DATA PER MEMORY CELL WITH HIGH RELIABILITY

TECHNICAL FIELD

At least some embodiments disclosed herein relate to memory systems in general, and more particularly, but not limited to techniques to program voltage thresholds of memory cells in memory systems to store multiple bits of data per memory cell.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
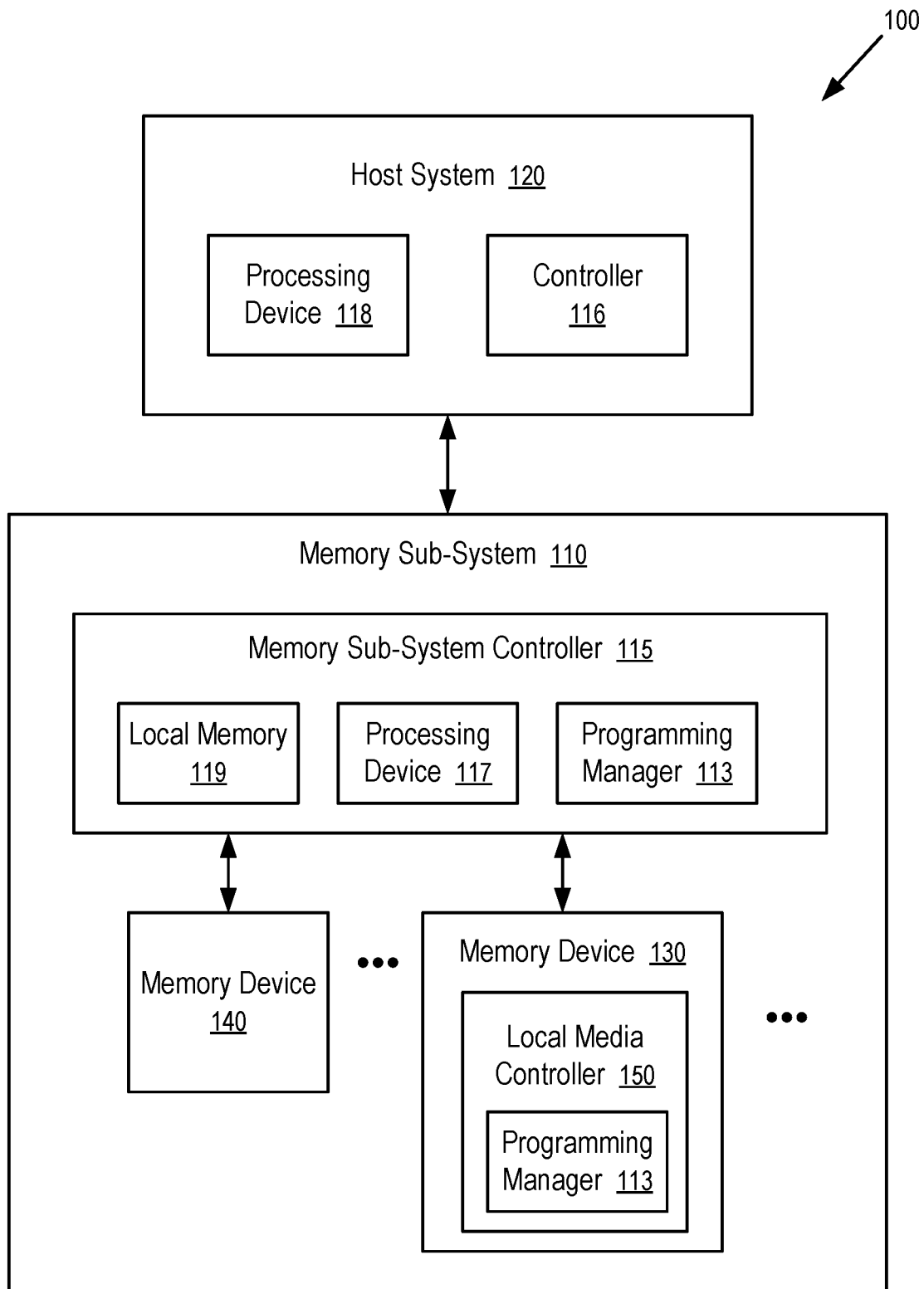
FIG. 1 illustrates an example computing system having a memory sub-system in accordance with some embodiments of the present disclosure.

At least some aspects of the present disclosure are directed to techniques to improve reliability of storing data in memory cells in a memory sub-system. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a predefined voltage. For example, if the memory cell is configured/programmed in a state that allows a substantial current to pass the memory cell at the predefined voltage, the memory cell is storing a bit of one; and otherwise, the memory cell is storing a bit of zero. Further, a memory cell can store multiple bits of data by being configured/programmed differently at multiple predefined voltages. For example, the memory cell can store multiple bits of data by having a combination of states at the multiple predefined voltages; and different combinations of the states of the memory cell at the predefined voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in data retrieved directly from the memory cells in the memory sub-system and/or recover the original data that is used to generate the data for storing in the memory cells. The recovery operation can be successful (or have a high probability of success) when the data retrieved directly from the memory cells in the memory sub-system contains fewer errors, or the bit error rate in the retrieved data is low. For example, error detection and data recovery can be performed using an Error Correction Code (ECC), such as Low-Density Parity-Check (LDPC) code, etc.

It can be desirable in some instances to store a reduced number of bits (e.g., N−1) per memory cell in a memory device that has the circuity to program the threshold voltages of a group of memory cells to store a predetermined number of bits (e.g., N) per memory cell. Adding separate circuity optimized to independently program the threshold voltages of the group of memory cells to store the reduced number of bits per memory cell (e.g., N−1) can lead to increased complexity and/or cost in the hardware of the memory device. Alternatively, an extra group of dummy data (e.g., all zeros, or all ones) can be supplied to increase the number of bits per cell (e.g., to N) to match the functionality of the existing circuity of the memory device in programming threshold voltages. However, storing the extra group of dummy data (e.g., all zeros, or all ones) for the given data having the reduced number of bits per memory cell (e.g., N−1), such that the total number of bits per memory cell is equal to the predetermined number (e.g., N), can lead to reduced reliability in retrieving data from the memory cells, as compared to programming the memory cells at the reduced number of bits (e.g., N−1) per memory cells.

At least some aspects of the present disclosure address the above and other deficiencies by generating the extra group of data from the given data having the reduced number of bits. The extra group of data can be generated to establish a predetermined relation among the groups of data to improve the reliability in retrieving data from the memory cells programmed at the predetermined number of bits per memory cell (e.g., N).

For example, the memory device can be configured to map the values of the predetermined number of bits (e.g., N) to a threshold voltage according to a Gray code (also known as reflected binary code or reflected binary) in programming the threshold voltages of memory cells to store data. The extra group of data can be generated based on an exclusive or (XOR) operation on the reduced number of bits (e.g., N−1). Alternatively, the inverse of the result of XOR (corresponding to XNOR on the reduced number of bits) can be used. Programming the extra group of data with the given data at the predetermined number of bits (e.g., N) per memory cell can result in high reliability in data retrieval.

Different combinations of values of a predetermined number of bits N can be used to represent different numbers from 0 to $2^N-1$. A Gray code is a mapping where one bit and only one bit is changed in the bit values when the number represented by the bit value combination changes to the next larger or smaller number. The threshold voltage of a memory cell can be programmed at one of $2^N$ levels to represent a combination of the values of the predetermined number (N) of bits. Having the threshold voltage of the memory cell programmed at a voltage level is representative of the memory cell storing the combination of values of the N bits corresponding to the voltage level. When a Gray code is used to map between the bit value combinations and the voltage threshold levels, only one bit changes its value when the threshold level moves up or down by one increment. By generating the extra group of data based on XOR/XNOR, the data set to be programmed has either missing odd numbered voltage threshold levels, or even numbered voltage threshold levels. Such an arrangement increases the gap between possible voltage thresholds representing different data and thus improves the reliability in reading data from the memory cells. Further, when one of the predetermined bits stored in a memory cell is found to be corrupted, it can be recovered from the remaining bits through XOR. Thus, the reliability in retrieving data programmed in such a manner is improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a programming manager 113 configured to program threshold voltages of memory cells to store a predetermined number of bits per memory cell by generating extra data from a dataset that has a reduced number of bits per memory cell. In some embodiments, the controller 115 in the memory sub-system 110 and/or the controller 150 in the memory device 130 can include at least a portion of the programming manager 113. In other embodiments, or in combination, the controller 116 and/or the processing device 118 in the host system 120 includes at least a portion of the programming manager 113. For example, the controller 115, the controller 116, and/or the processing device 118 can include logic circuitry implementing the programming manager 113. For example, the controller 115, or the processing device 118 (e.g., processor) of the host system 120, can be configured to execute instructions stored in memory for performing the operations of the programming manager 113 described herein. In some embodiments, the programming manager 113 is implemented in an integrated circuit chip disposed in the memory sub-system 110. In other embodiments, the programming manager 113 can be part of firmware of the memory sub-system 110, an operating system of the host system 120, a device driver, or an application, or any combination therein.

For example, the programming manager 113 implemented in the controller 115 and/or the controller 150 can receive a reduced number (e.g., N−1) of data groups (e.g., pages) for programming into the memory cells in the memory device 130 that stores a predetermined number (e.g., N) of bits per memory cells. The programming manager 113 generates an extra group (e.g., page) of data by applying an XOR (or XNOR) operation on the reduced number of data groups. A combination of the extra group and the reduced number of groups provides the predetermined number of groups for storing into the group of memory cells. When the memory device 130 has the predetermined number of data groups, the memory device 130 programs threshold voltages of a group of memory cells to store the predetermined number of data groups at the predetermined number of bits per memory cell, using a mapping between the threshold voltage levels and the bit value combinations that is in accordance with a Gray code. As result, the reliability of retrieving data from the memory cells is improved.

Figure 2:
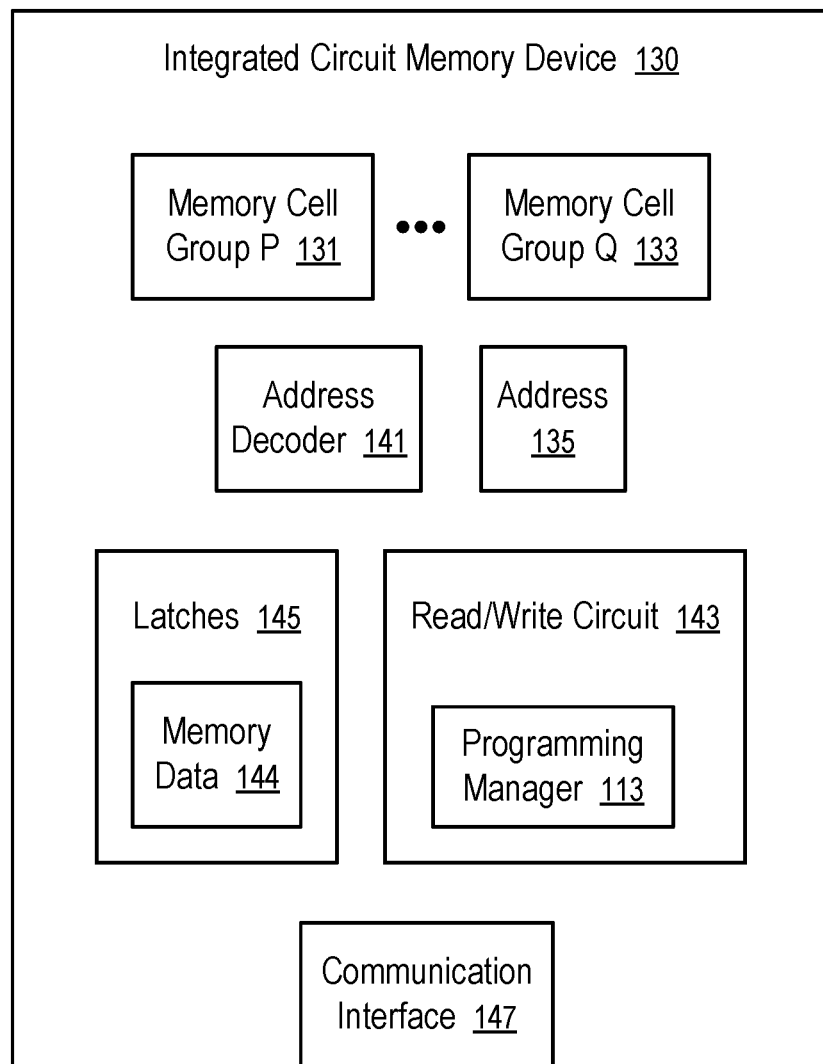
FIG. 2 illustrates an integrated circuit memory device having a programming manager configured to program threshold voltages of memory cells to store data according to one embodiment.

FIG. 2 illustrates an integrated circuit memory device having a programming manager configured to program threshold voltages of memory cells to store data according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131 (or group 133) can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve memory data 144 from memory cells identified by the memory address 135, and provide at least the memory data 144 as part of a response to the command. Optionally, the memory device 130 may decode the memory data 144 (e.g., using an error-correcting code (ECC) technique) and provide the decoded data as part of a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the memory data 144 stored in the memory cells at the address 135.

The integrated circuit memory device 130 has a set of latches 145 to hold memory data 144 temporarily while the read/write circuit 143 is programming the threshold voltages of a memory cell group (e.g., 131 or 133). For example, the read/write circuit 143 can program the threshold voltages of memory cells in a memory cell group 131 to store N bits per memory cell. The memory cell group (e.g., 131 or 133) has M memory cells. The latches 145 are configured to store N×M bits of data in the form of N data groups. Each of the data group has M bits of data to be stored respectively into M memory cells in the memory cell group (e.g., 131 or 133).

When the latches 145 have N data groups to be stored into a memory cell group (e.g., 131), the programming manager 113 is configured to determine and program threshold voltage levels of memory cells in the memory cell group (e.g., 131). The threshold voltage levels are according to the values of bits in the memory data 144 and a Gray code that maps bit value combinations to threshold levels, such that any two combinations of bit values represented by two successive threshold levels differ by and only by one bit.

Figure 6:
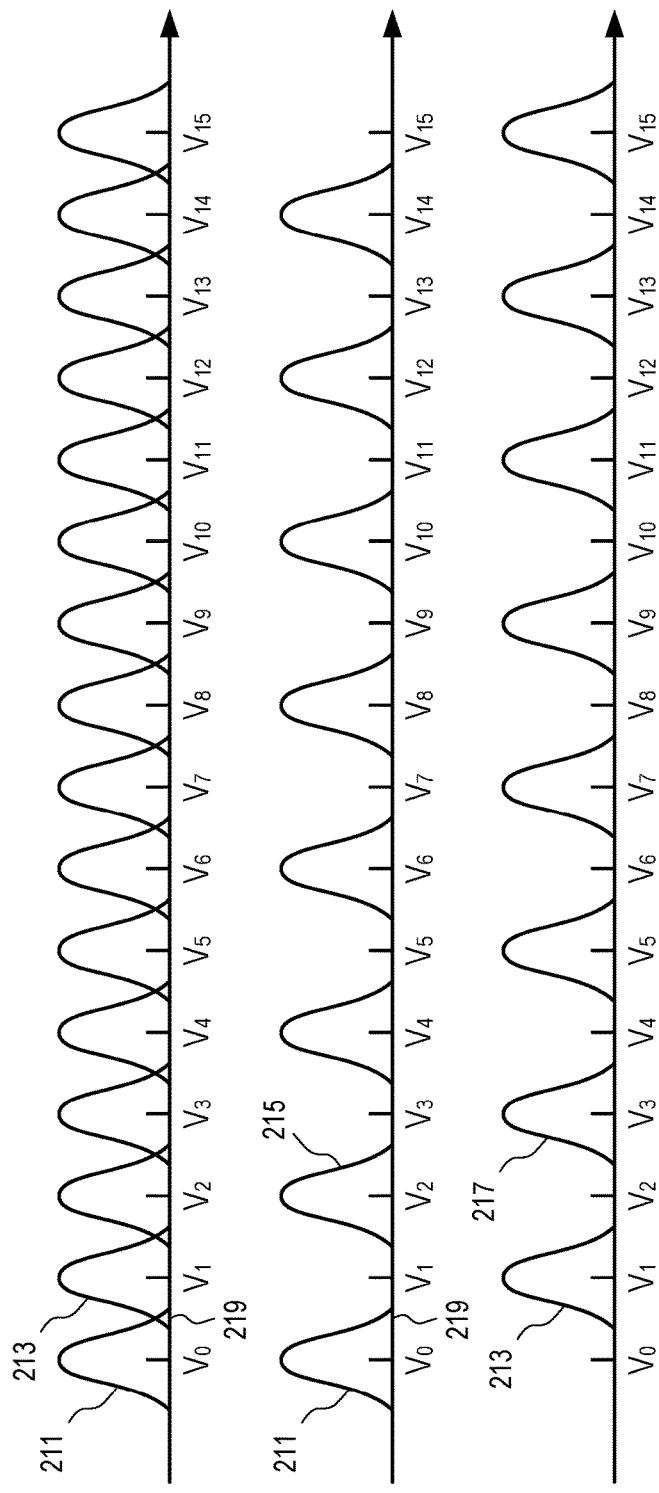
FIG. 6 illustrates reliability improvements in reading data programmed using techniques of FIGS. 4 and 5.

In one embodiment, when the memory device 130 receives N−1 data groups for storing in a memory cell group (e.g., 131), the programming manager 113 generates the Nth data group by applying XOR (or XNOR) on the N−1 data groups. Since the programming manager 113 programs the threshold voltages of the memory cell group (e.g., 131) according to the Gray code, the threshold voltages of the memory cells in the group (e.g., 131) are automatically optimized for high reliability, as illustrated in the example of FIG. 6.

In another embodiment, the programming manager 113 implement in the controller 115 of the memory sub-system 110 is configured to generate the Nth data group such that N groups of data, provided in the latches 145 for storing into the memory cell group (e.g., 131), are related to each other through XOR (or XNOR). In such a scenario, it is not necessary for the read/write circuit 143 to be aware of the generation of the Nth data group, or the relation among the N data groups. The memory device 130 can program the N XOR-related (or XNOR-related) groups of data in the latches 145 in the same way N independent groups of data are programmed. By programming the N data group generated by the controller 115 of the memory sub-system 110 to have the XOR/XNOR relation, the reliability of retrieving data from the memory cell group (e.g., 131) is automatically improved, as illustrated in the example of FIG. 6.

In a further embodiment, a programming manager 113 implemented in the host system 120 is configured to generate the N data groups that are related to each other via XOR or XNOR. When such a set of N data groups is provided into the latches 145 as memory data 144 for programming into a memory cell group (e.g., 131 or 133) according to a Gray code, the reliability of retrieving data from the memory cell group (e.g., 131) is automatically improved.

Figure 3:
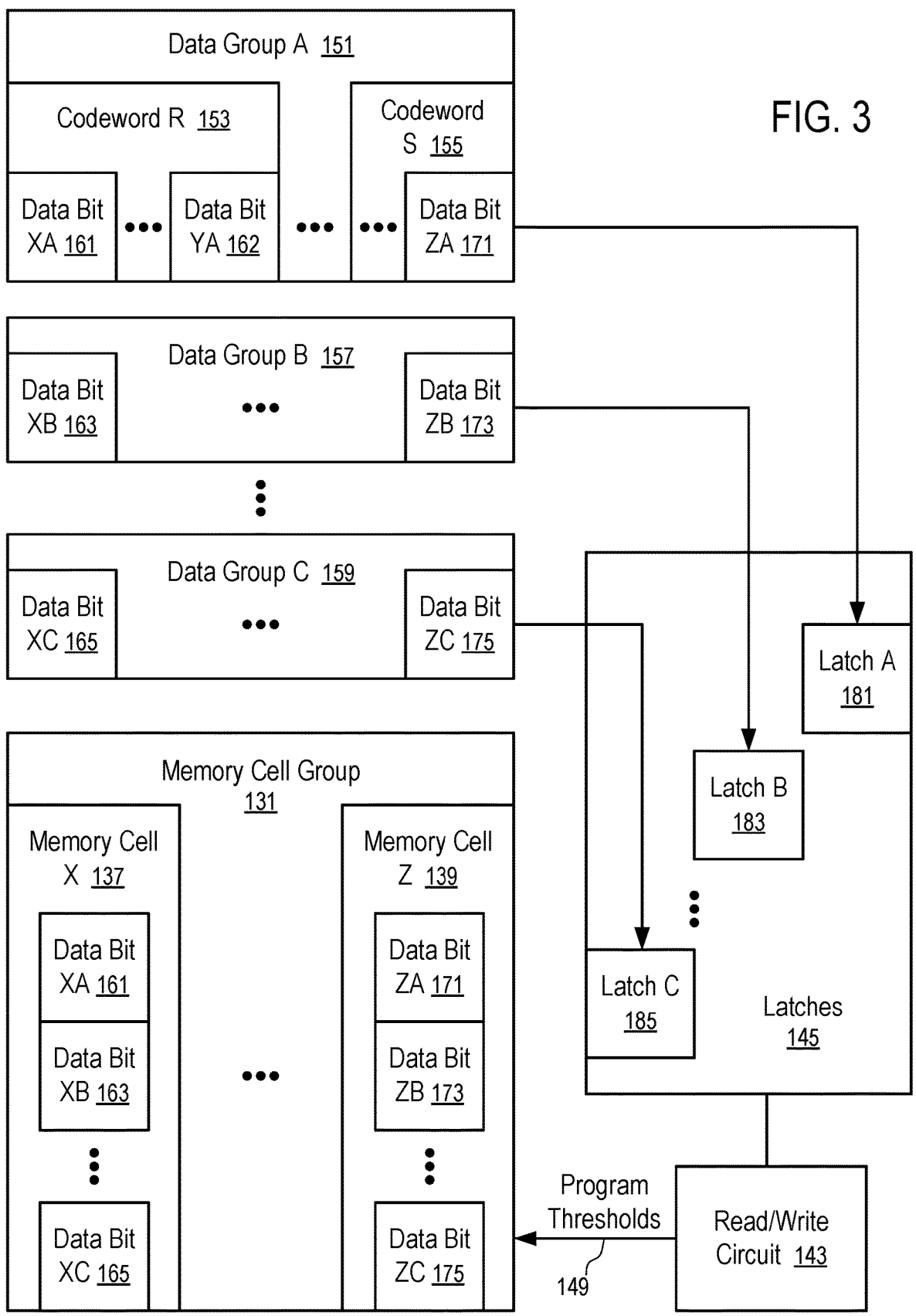
FIG. 3 shows an example of programming memory cells to store multiple bits per memory cell according to one embodiment.

FIG. 3 shows an example of programming memory cells to store multiple bits per memory cell according to one embodiment. For example, the example of FIG. 3 can be implemented in the memory device 130 of FIG. 1 and/or FIG. 2.

In FIG. 3, a memory cell group 131 has memory cells 137, ..., 139. A number of data groups 151, 157, ..., 159 provide data bits to be stored into the memory cells 137, ..., 139. The number of bits provided in each data group (e.g., 157, 159, or 151) equals to the number of memory cells 137 to 139 in the memory cell group 131. Each memory cell (e.g., 139 or 137) stores a set of bits, one from each of the data groups 151, 157, ..., and 159.

For example, the data bits 161, 163, ..., 165 from the data groups 151, 157 ..., 159 are stored into one memory cell 137; and the voltage threshold of the memory cell 137 is programmed by the read/write circuit 143 at a level that represents the values of the data bits 161, 163, ..., 165. Similarly, the data bits 171, 173, ..., 175 from the data groups 151, 157 ..., 159 are stored into another memory cell 139 and represented by the level of the voltage threshold of the memory cell 139.

Optionally, the data bits in a data group can be organized in codeword 153, codeword 155 according to an error detection and data recovery technique, such as Error Correction Code (ECC), Low-Density Parity-Check (LDPC) code, For example, a codeword 153 in the data group 151 can include data bit 161 to data bit 162. When one of data bit in the codeword 153 is in error, the error can be detected and corrected (e.g., using a technique of Low-Density Parity-Check (LDPC)).

When the data groups 151, 157, ..., 159 are stored in the latches 181, 183, ..., 185, the read/write circuit 143 can program 149 thresholds of the memory cells 137, ..., 139 such that the voltage thresholds of the memory cells 137, ..., 139 represent the values of the respective data bits from the data groups 151, 157, ..., 159.

A combination of the values of the data bits (e.g., 161, 163, ..., 165) to be stored in a memory cell (e.g., 137) is mapped to the level of a voltage threshold of the memory cell (e.g., 137) based on a Gray code. For example, a read/write circuit 143 can include a table of a Gray code (e.g., as illustrated by the table of FIG. 6) to map between the values of a set of bits (e.g., 161, 163, ..., 165) of a memory cell (e.g., 137) and a threshold level of the memory cell (e.g., 137) that represents the values of the set of bits (e.g., 161, 163, ..., 165).

When it is desirable to store a reduced number of data groups (e.g., 157 to 159) in the memory cell group 131, an extra data group (e.g., 151) can be computed based on an XOR (or XNOR) operation, such that the reliability of the memory data 144 stored in the memory cells (e.g., 137 to 139) in the form of their programmed voltage thresholds according to a Gray code is automatically improved and/or optimized.

Figure 4:
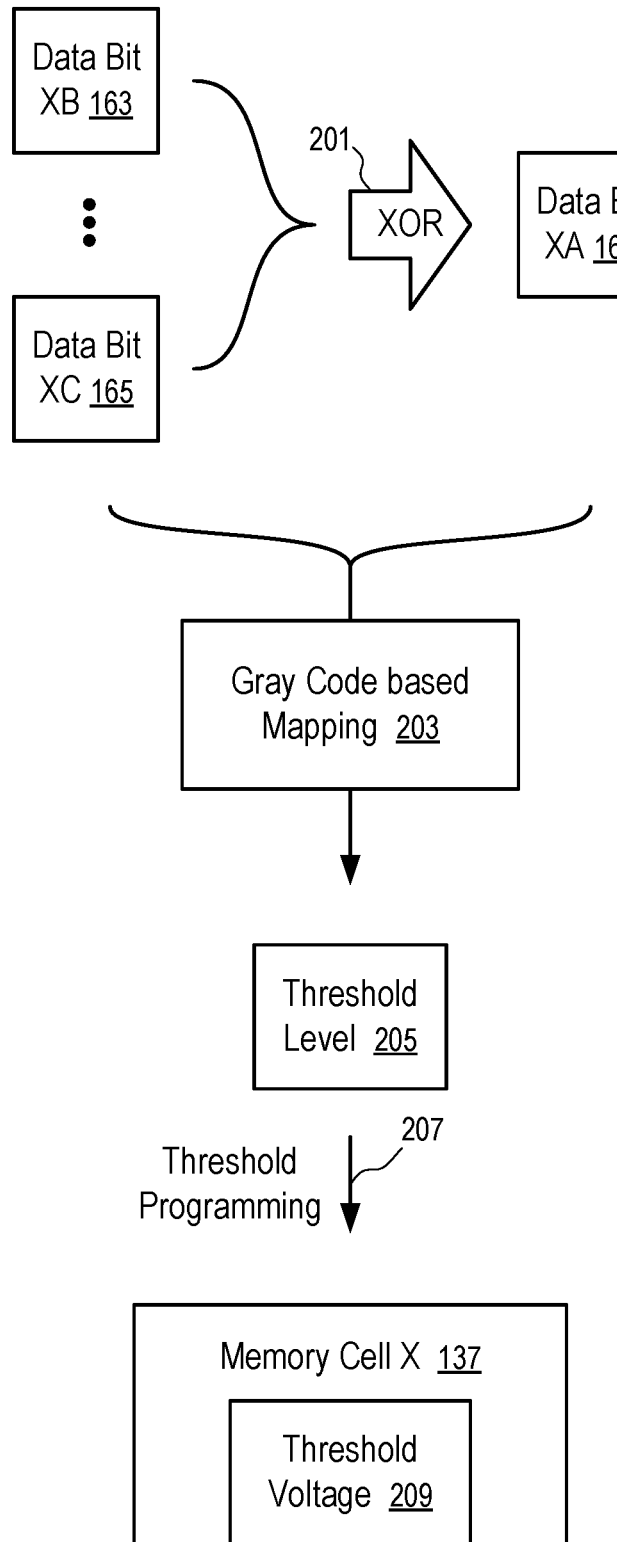
FIGS. 4 and 5 illustrate techniques generate a data group for programming memory cells at threshold levels determined by a Gray code for improved reliability according to some embodiments.
Figure 5:
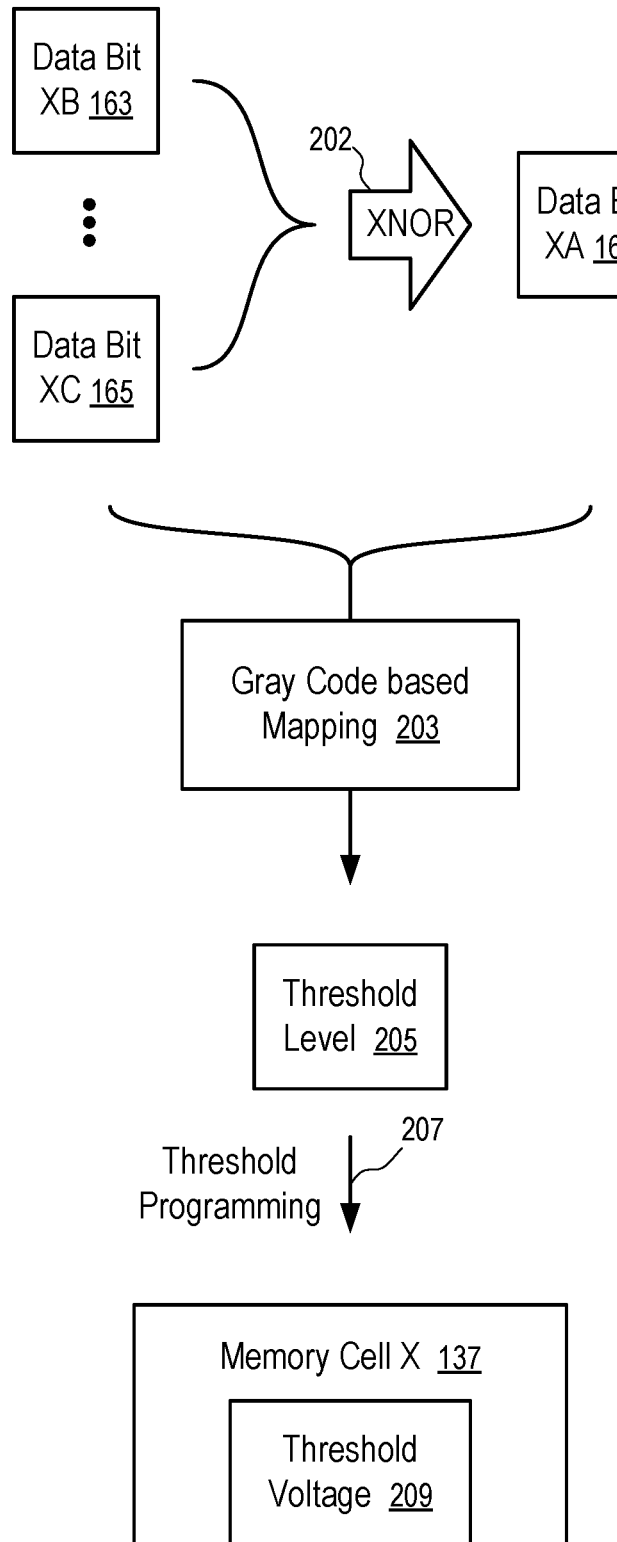

FIGS. 4 and 5 illustrate techniques generate a data group for programming memory cells at threshold levels determined by a Gray code for improved reliability according to some embodiments.

In FIG. 4, data bit 161 is calculated by applying XOR operation 201 to data bits 163 to 165. For example, after computing the result of exclusive or of two of the data bits 163 to 165, an updated result can be obtained from the exclusive or of the result and another of the data bits 163 to 165 until all of the data bits 163 to 165 have participated in the exclusive or computations once. As a result, data bits 161, 163, ..., 165 form an exclusive or relation, where any of the data bit (e.g., 161 or 163) is equal to the result of applying XOR operation 201 to the other data bits.

For example, to store data groups 157 to 159 into a memory cell group 131 using the read/write circuit 143 of FIG. 3, an extra data group 151 is calculated from the exclusive or of the data groups 151, 157 to 159. Each data bit (e.g., 161) in the data group 151 is obtained by applying XOR operation 201 the corresponding data bits (e.g., 163, ..., 165) in the given data groups 157, ..., 159.

As a result, each codeword (e.g., 153) in the data group 151 is also the result of bitwise exclusive or of the corresponding codewords in the given data groups 157, ..., 159; and the codewords in the data groups 151, 157, ..., 159 form the exclusive or relation, where any codeword in a data group (e.g., 157) is equal to the exclusive or of the corresponding codeword from the remaining data groups (e.g., 151, 159, ...). Such a property/relation can be used to recover a codeword in a data group when the codeword fails to decode in ECC/LDPC operations.

FIG. 4 illustrates an example of using XOR operation 201 to generate an extra data group 151. Similarly, FIG. 5 illustrates another example of using XNOR operation 202 to generate an extra data group 151. The extra data group 151 computed using XNOR operation 202 is equal to the bitwise not of the corresponding data group 151 computed using XNOR operation 202. When the XNOR operation 202 is used to generate the extra data group 151, the codewords in the data groups 151, 157, ..., 159 form the XNOR relation, where any codeword in a data group (e.g., 157) is equal to the XNOR of the corresponding codeword from the remaining data groups (e.g., 151, 159, ...). Such a property/relation can also be used to recover a codeword in a data group when the codeword fails to decode in ECC/LDPC operations.

In FIGS. 4 and 5, the set of data bits 161, 163, ..., 165 having the XOR or XNOR relation is used in Gray code based mapping 203 to determine threshold level 205 to be programmed for a memory cell 137. After threshold programming 207 of the memory cell 137 to reach the threshold level 205, the memory cell 137 has a threshold voltage 209 that can be detected/tested via the read/write circuit 143; and the values of the data bits 161, 163, ..., 165 can be determined/inferred from the threshold voltage 209 of the memory cell 137.

The XOR or XNOR relation among the data groups 151, 157, ..., 159 not only allows the recovery of a failed codeword in a data group from other data groups, but also improves the reliability of determining of the threshold levels (e.g., 205) of the memory cells (e.g., 137) and thus the reading of the memory data 144 represented by the programmed threshold voltages (e.g., 209), as further illustrated in FIG. 6.

FIG. 6 illustrates reliability improvements in reading data programmed using techniques of FIGS. 4 and 5.

FIG. 6 illustrates an example of data programming in a QLC mode where the threshold voltage of a memory cell (e.g., 137) is programmed to represent the values of four bits. A page of memory cells is programmed (written into) together. Since each cell stores four bits, the page of memory cells can store four data pages of data bits, where the number of data bits in a data page is equal to the number of memory cells in a memory cell page. For example, each data page is an example of a data group illustrated in FIG. 3; and the memory cell page is an example of a memory cell group illustrated in FIG. 3.

Conventionally and/or for convenience, the four data pages for a QLC mode are named as lower page (LP), upper page (UP), extra page (XP), and top page (TP) respectively. A memory cell (e.g., 137) stores one bit from each of the four pages. Since the values of the four bits stored in a memory cell (e.g., 137) has 16 different combinations, as illustrated in the table shown in FIG. 6, the threshold voltage 209 of the memory cell (e.g., 137) is programmed to one of 16 threshold levels to represent a corresponding combinations of bit values.

The table shown in FIG. 6 illustrates an example Gray code that maps between the values of the four bits (e.g., 161, 163, . . . , 165) stored in a QLC memory cell (e.g., 137) and the threshold level 205 of the memory cell (e.g., 137). For example, when the memory cell (e.g., 137) is determined to have a threshold level of 0, the memory cell (e.g., 137) is considered to store 1 as the TP bit, 1 as the XP bit, 1 as the UP bit, and 1 as the LP bit. Similarly, to store 0, 1, 1, and 1 as TP, XP, UP and LP bits in the memory cell (e.g., 137), the threshold voltage is programmed to level 1. An increasing threshold level represents an increasing threshold voltage 209 to be programmed for the memory cell (e.g., 137).

A Gray code (e.g., as illustrated in the table of FIG. 6) has the characteristics/propriety where one and only one bit value changes between two successive threshold levels. For example, when threshold level changes from 0 to 1, only the TP bit changes from 1 to 0 in the table of FIG. 6. Similarly, when threshold level changes between 1 and 2 (or, 2 and 3, 3 and 4, 4 and 5, etc.), only the LP bit changes (or, the TP bit, the UP bit, the TP bit, etc. respectively).

In general, different Gray codes can be used to map the combinations of bit values to threshold levels. For example, by inverting the bits in the table of FIG. 6, we obtain an alternative Gray code for mapping bit values to threshold levels. The techniques of the present disclosures are not limited to the use of a particular Gray code.

In generally, after the read/write circuit 143 completes its operation to programs the threshold voltage 209 of a memory cell 137 according to a threshold level 205, the threshold voltage 209 of the memory cell 137 may not be at an exact predetermined voltage. After the threshold programming 207, the threshold voltage 209 of the memory cell 137 is most likely at a predetermined voltage, with reduced probability at other voltages away from the predetermined voltage.

For example, when the memory cell 137 is programmed to threshold level 0, the threshold voltage 209 of the memory cell 137 being at the voltage $V_0$ has the highest probability. The probability distribution of the threshold voltage 209 of the memory cell 137 being at voltages near $V_0$ is illustrated by the curve 211.

Similarly, the probability distribution of the threshold voltage 209 of the memory cell 137 being at voltages near $V_1$ when the memory cell 137 is programmed to threshold level 1 is illustrated by the curve 213.

In the voltage region 219, the probability distribution curve 211 and curve 213 overlap with each other, which indicates that when the threshold voltage 209 of the memory cell 137 is found to be within the region 219, there is an ambiguity as to whether the memory cell 137 is programmed at threshold level 0 to represent one set of bit values, or at threshold level 1 to represent another set of bit values. Since the bit values represented by threshold level 0 and threshold level 1 differ by one bit (e.g., TP bit when the Gray code as illustrated in the table of FIG. 6 is used), there is a small probability that this bit, determined based on the threshold voltage of the memory cell 137, is read incorrectly. An error in such a bit can be typically detected and corrected via ECC/LPDC decoding of a codeword (e.g., 153) in a data group (e.g., 151) that contains the bit.

When the TP, XP, UP and LP bits are known to have an XOR relation, the combination of bit values corresponding to threshold level 1 in the table of FIG. 6 is not possible. For example, the combination of bit values corresponding to threshold level 1 does not have the XOR relation and thus is eliminated from a possible data item given for storing in the memory cell 137. Thus, the closest distribution curve 215 to the curve 211 is for threshold level 2 and is better separated from the curve 211 by a wide margin in voltage threshold. This reduces/eliminates the probability of reading error when the threshold voltage of the memory cell 137 is found to be in the voltage region 219.

Similarly, the use of a Gray code and the XOR relation eliminates the combinations of bit values corresponding to other odd numbered threshold levels (e.g., 3, 5, . . . , 15). Thus, the possible distribution curves 211, 215, etc., are well separated for improved data reliability.

Similarly, when the TP, XP, UP and LP bits are configured to have an XNOR relation, the combinations of bit values corresponding to even threshold levels (e.g., 0, 2, . . . , 14) are eliminated. Thus, the possible distribution curves 213, 217, etc., are also well separated for improved data reliability.

Therefore, FIG. 6 shows that, by configuring the TP, XP, UP and LP bits to have an XOR or XNOR relation, the reliability of retrieving the TP, XP, UP and LP bits through the determination of the level of the threshold voltage 209 of the memory cell 137 is improved.

In general, the separation of distribution curves can be achieved with any Gray code for data bits having an XOR relation or an XNOR relation. Thus, the improvement is not limited to the use of a particular Gray code illustrated in the table of FIG. 6. Further, the separation is not limited to QLC memory cells. For example, the technique can be applied to TLC memory cells, or PLC memory cells.

The threshold voltages of memory cells can change due to a number of factors, such as charge loss, read disturb, cross-temperature effect (e.g., write and read at different operating temperatures). Such changes and/or other factors can cause errors in reading the memory cells. Such errors can typically be discovered and/or corrected during the decoding of a codeword using ECC/LDPC techniques. However, when a codeword fails to decode, the XOR relation (or the XNOR relation) can be used to recover the codeword in a way as illustrated in FIG. 7.

Figure 7:
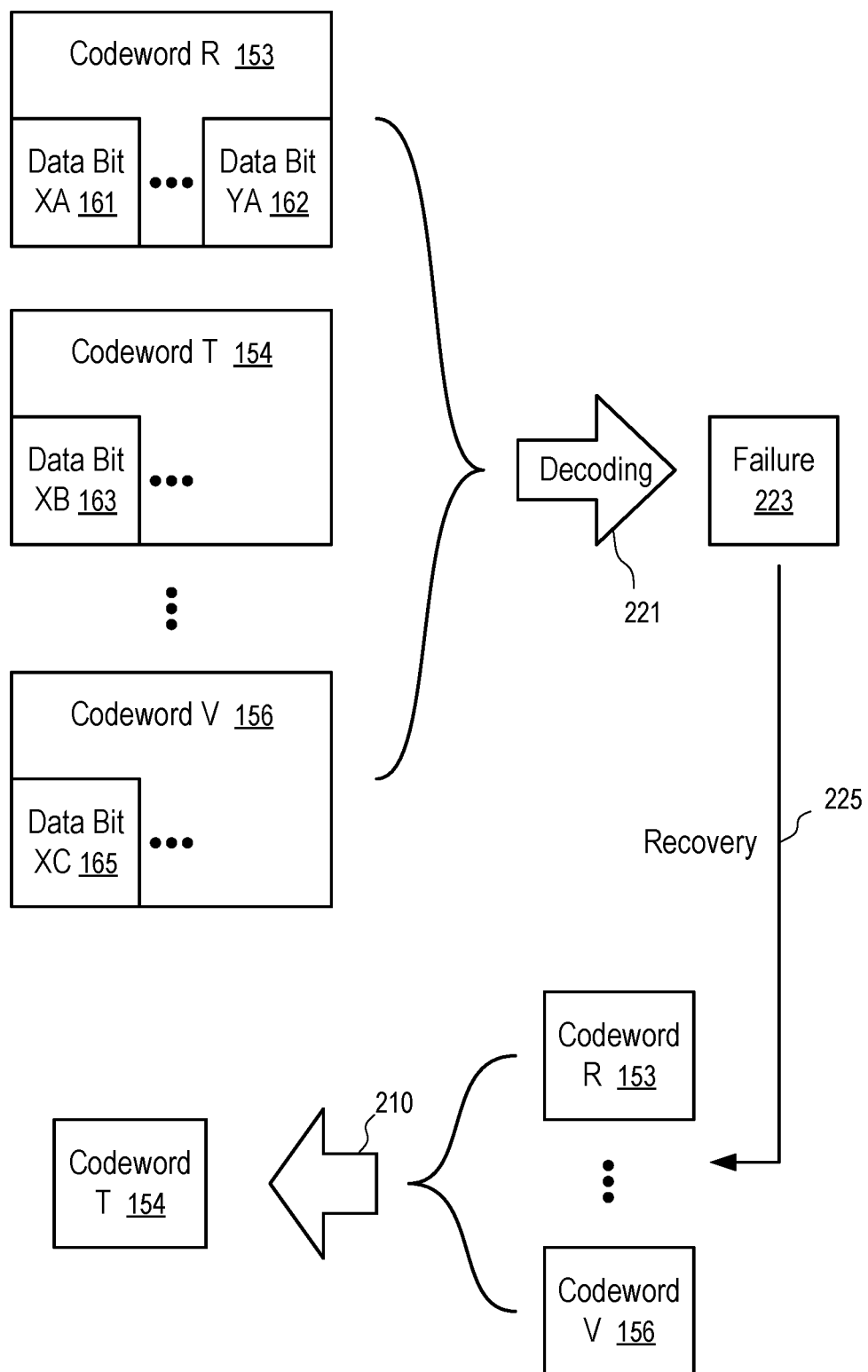
FIG. 7 shows a technique to recover data retrieved from memory cells programmed using the techniques of FIGS. 4 and 5.

FIG. 7 shows a technique to recover data retrieved from memory cells programmed using the techniques of FIGS. 4 and 5.

In FIG. 7, one of the codewords 153, 154, . . . , and 156 can encounter a failure 223 during the operation of decoding 221 using ECC/LDPC techniques, after the codewords are read from the memory cell group 131. For example, a codeword 154 may fail to decode. Since the codewords 153, 154, ..., 156 correspond to respective codewords in the data groups 151, 157, ..., 159 that have an XOR (or XNOR) relation, a replacement of the codeword 154 can be found during recovery 225 by applying the corresponding operation 210 (e.g., XOR or XNOR) to the remaining codewords 153 to 156.

Figure 8:
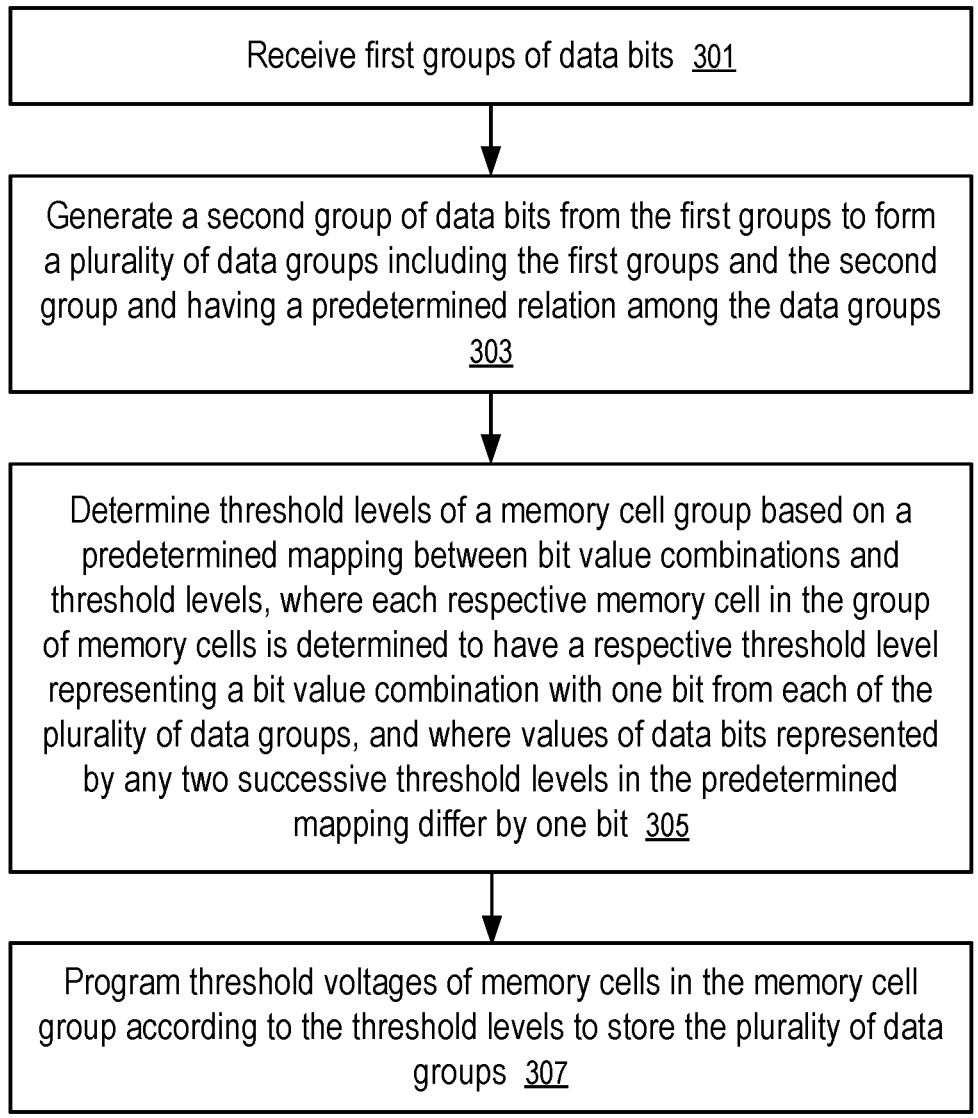
FIG. 8 shows a method to write data into memory cells according to some embodiments.

FIG. 8 shows a method to write data into memory cells according to some embodiments. The methods of FIG. 8 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 8 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the methods of FIG. 8 can be performed in a memory sub-system 110 illustrated in FIG. 1 using an integrated circuit memory device 130 of FIG. 2 with data programming techniques of FIGS. 3 to 7.

At block 301, first groups (e.g., 157, ..., 159) of data bits (e.g., 163, ..., 173, 165, ..., 175) are received for storing into a memory cell group (e.g., 131) of a memory device 130. The memory device 130 can program more groups of data bits into the memory cell group (e.g., 131) than the first groups (e.g., 157, ..., 159).

At block 303, a second group (e.g., 151) of data bits (e.g., 161, ..., 162, ..., 171) is generated from the first groups (e.g., 157, ..., 159) to form a plurality of data groups (e.g., 151, 157, ..., 159). The plurality of data groups (e.g., 151, 157, ..., 159) includes the first groups (e.g., 157, ..., 159) and the second group (e.g., 151) and has a predetermined relation among the data groups (e.g., 151, 157, ..., 159).

For example, the predetermine relation can be an XOR relation such that any of the data groups (e.g., 151, 157, ..., 159) is equal to the XOR of the remaining groups. Alternatively, the predetermine relation can be an XNOR relation such that any of the data groups (e.g., 151, 157, ..., 159) is equal to the XNOR of the remaining groups.

Each respective data bit (e.g., 161) in the second group (e.g., 151) can be based on exclusive or (XOR) of a data bit set (e.g., 163, ..., 165) having a data bit from each of the first groups (e.g., 157, ..., 159).

For example, the respective data bit (e.g., 161) is equal to, and/or be calculated from, exclusive or (XOR) of data bits (e.g., 163, ..., 165) in the data bit set having a data bit from each of the first groups (e.g., 157, ..., 159).

Alternatively, the respective data bit (e.g., 161) is equal to the inverse of exclusive or (XOR) of data bits (e.g., 163, ..., 165) in the data bit set having a data bit from each of the first groups (e.g., 157, ..., 159). For example, the respective data bit (e.g., 161) can be computed as the XNOR of the data bits (e.g., 163, ..., 165) in the data bit set having a data bit from each of the first groups (e.g., 157, ..., 159).

For example, the second group (e.g., 151) can be generated from bitwise XOR, or bitwise XNOR, of the first groups (e.g., 157, ..., 159).

At block 305, the memory device 130 determines threshold levels (e.g., 205) of a memory cell group (e.g., 131) based on a predetermined mapping between bit value combinations and threshold levels (e.g., as illustrated via the Gray code shown in the table of FIG. 6). Each respective memory cell in the group of memory cells is determined to have a respective threshold level representing a bit value combination with one bit from each of the plurality of data group; and values of data bits represented by any two successive threshold levels in the predetermined mapping differ by and only by one bit, as in a Gray code (also known as a reflected binary code).

At block 307, the memory device 130 programs threshold voltages (e.g., 209) of memory cells (e.g., 137) in the memory cell group (e.g., 131) according to the threshold levels (e.g., 205) determined by the predetermined mapping to store the plurality of data groups (e.g., 151, 157, ..., 159).

For example, by generating the second group (e.g., 151) from three first groups (e.g., 157, ..., 159), the threshold voltages (e.g., 209) of the memory cells (e.g., 137) in the memory cell group (e.g., 131) can be programmed in a quad-level cell (QLC) mode to store four bits per memory cell with high reliability.

In general, XOR or XNOR can be used to generate an Nth data group from N−1 data groups to store the N data groups in a memory cell group with N bits per memory cell.

As an example, the plurality of data groups can include a third group (e.g., 157) and fourth groups (e.g., 151, 159, ...). When the memory data 144 is retrieved from the memory cell group 131 based on testing the threshold voltages of memory cells (e.g., 137) in the memory cell group (e.g., 131), the third group (e.g., 157) can include a first codeword (154) in the third group (e.g., 157) that fails to decode in an ECC/LDPC decoder. In response, second codewords (e.g., 153, ..., 156) in the fourth groups (e.g., 151, 159, ...) can be used to compute a replacement version of the first codeword (154).

Figure 9:
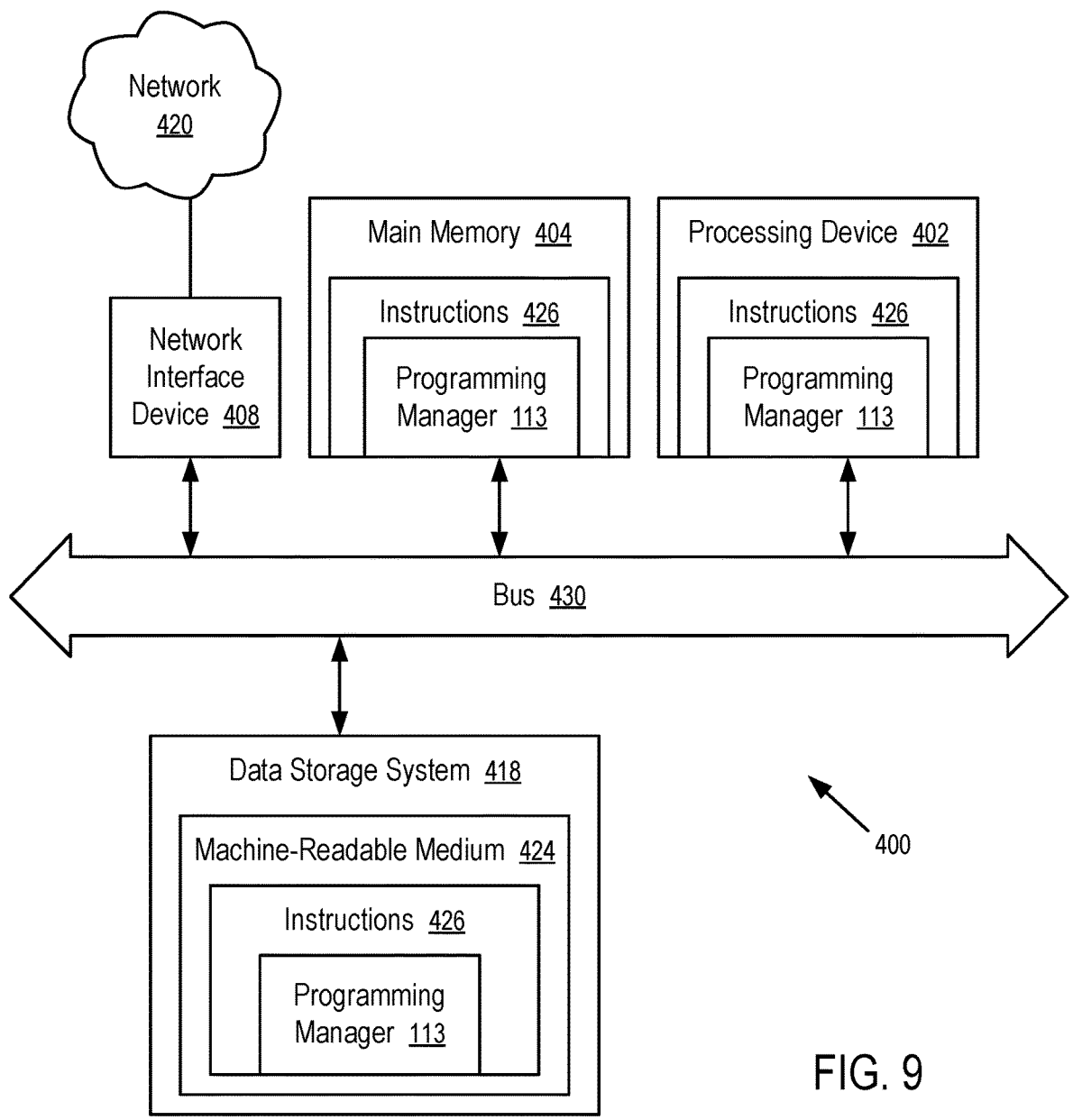
FIG. 9 is a block diagram of an example computer system in which embodiments of the present disclosure can operate.

FIG. 9 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a programming manager 113 (e.g., to execute instructions to perform operations corresponding to the programming manager 113 described with reference to FIGS. 1-8). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a programming manager 113 (e.g., the programming manager 113 described with reference to FIGS. 1-8). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving first groups of data bits;
prior to programming the first groups of data bits into a memory, generating a second group of data bits from the first groups to form a plurality of data groups comprising the first groups and the second group and having a predetermined relation among the data groups, wherein the generating of each respective data bit in the second group comprises performing an exclusive or operation or an exclusive nor operation on a data bit set having a data bit from each of the first groups;
determining threshold levels of a memory cell group based on a predetermined mapping between bit value combinations and threshold levels, wherein each respective memory cell in the memory cell group is determined to have a respective threshold level representing a bit value combination with one bit from each of the plurality of data groups, and wherein values of data bits represented by any two successive threshold levels in the predetermined mapping differ by one bit; and
after the generating of the second group, programming threshold voltages of memory cells in the memory cell group according to the threshold levels to store the plurality of data groups comprising the first groups and the second group, wherein each data bit from each of the first groups is programmed into a memory cell along with a respective data bit from the second group that represents the result of the exclusive or operation or the exclusive nor operation.

2. The method of claim 1, wherein the respective data bit is equal to exclusive or of data bits in the data bit set having a data bit from each of the first groups.

3. The method of claim 1, wherein the respective data bit is equal to inverse of exclusive or of data bits in the data bit set having a data bit from each of the first groups.

4. The method of claim 1, wherein the second group is generated from XOR of the first groups.

5. The method of claim 1, wherein the second group is generated from XNOR of the first groups.

6. The method of claim 1, wherein the threshold voltages of the memory cells in the memory cell group are programmed in a quad-level cell mode to store four bits per memory cell; and a group count of the first groups is three.

7. The method of claim 1, wherein the plurality of data groups includes a third group and fourth groups; wherein the method further comprises:
reading the memory cell group to retrieve memory data based on threshold voltages of memory cells in the memory cell group, the memory data corresponding to the plurality of data groups;
determining that a first codeword in the memory data corresponding to a third group fails to decode; and
computing a version of the first codeword from second codewords in the memory data corresponding to fourth groups.

8. A memory device, comprising:
an integrated circuit package enclosing the memory device; and
a plurality of memory cell groups formed on at least one integrated circuit die;
wherein in response to a command identifying a memory cell group within the plurality of memory cell groups, the memory device is configured to,
receive first groups of data bits;
generate, prior to the first groups being programmed into a memory, a second group of data bits from the first groups to form a plurality of data groups comprising the first groups and the second group, wherein the generation of each respective data bit in the second group comprises performing an exclusive or operation or an exclusive nor operation on a data bit set having a data bit from each of the first groups;
determine threshold levels of memory cells in the memory cell group based on a predetermined mapping between bit value combinations and threshold levels, wherein each respective memory cell in the memory cell group is determined to have a respective threshold level representing a bit value combination with one bit from each of the plurality of data groups, and wherein values of data bits represented by any two successive threshold levels in the predetermined mapping differ by and only by one bit; and
after the generation of the second group, program threshold voltages of memory cells in the memory cell group according to the threshold levels to store the plurality of data groups comprising the first groups and the second group, wherein each data bit from each of the first groups is programmed into a memory cell along with a respective data bit from the second group that represents the result of the exclusive or operation or the exclusive nor operation.

9. The memory device of claim 8, wherein each respective data bit in the second group is generated based on exclusive or of a data bit set having a data bit from each of the first groups.

10. The memory device of claim 9, wherein the memory device is configured to apply an XOR operation on the data bit set to generate the respective data bit.

11. The memory device of claim 9, wherein the memory device is configured to apply an XNOR operation on the data bit set to generate the respective data bit.

12. The memory device of claim 8, wherein the memory device is configured to generate the plurality of data groups to have an XOR relation.

13. The memory device of claim 8, wherein the memory device is configured to generate the plurality of data groups to have an XNOR relation.

14. A memory sub-system, comprising:
a processing device; and
at least one memory device, the memory device having a memory cell group formed on an integrated circuit die, the memory device configured to program threshold levels of the memory cell group at a predetermined number of bits per memory cell according to a Gray code to represent bit values stored in a memory cell by a threshold level of the memory cell;
wherein the processing device is configured to, prior to programming first groups of data bits into the memory device, generate a plurality of data groups from first groups of data bits, the first groups of data bits having less than the predetermined number of bits per memory cell for the memory cell group, the plurality of the data groups having the predetermined number of bits per memory cell for the memory cell group, wherein the generation of each respective data bit in the plurality of data groups comprises performing an exclusive or operation or an exclusive nor operation on a data bit set having a data bit from each of the first groups of data bits; and wherein the processing device is configured to, after the generating of the plurality of the data groups, provide the plurality of data groups to the memory device to store data from each of the plurality of data groups in each memory cell in the memory cell group, wherein the plurality of data groups comprises the first groups and the result of the exclusive or operation or the exclusive nor operation on the first groups, wherein each data bit from each of the first groups is programmed into a memory cell along with a respective data bit from the result of the exclusive or operation or the exclusive nor operation.

15. The memory sub-system of claim 14, wherein bit values represented by two successive threshold levels differ by and only by one bit; and the plurality of data groups includes the first groups of data bits and a second group of data bits computed from the first groups of data bits.

16. The memory sub-system of claim 14, wherein the processing device is configured to compute the second group of data bits as XOR of the first groups of data bits.

17. The memory sub-system of claim 14, wherein the processing device is configured to compute the second group of data bits as XNOR of the first groups of data bits.

18. The memory sub-system of claim 14, wherein the data groups provided to the memory device for storing is a plurality of first data groups; the processing device is configured to receive a plurality of second data groups from the memory device reading the memory cell groups; and in response to a first codeword in the second data groups failing to decode based on an error correction code, the processing device is further configured to compute a replacement of the first codeword from second codewords, each of the second codewords being from a different one of the second data groups.

19. The memory sub-system of claim 18, wherein the error correction code includes a low-density parity-check code; and the replacement of the first codeword is computed from XOR or XNOR of the second codewords.

20. A method, comprising:
receiving first groups of data bits;
generating a second group of data bits from the first groups to form a plurality of data groups comprising the first groups and the second group and having a predetermined relation among the data groups, wherein the plurality of data groups includes a third group and a fourth group;

determining threshold levels of a memory cell group based on a predetermined mapping between bit value combinations and threshold levels, wherein each respective memory cell in the group of memory cells is determined to have a respective threshold level representing a bit value combination with one bit from each of the plurality of data groups, and wherein values of data bits represented by any two successive threshold levels in the predetermined mapping differ by one bit; and programming threshold voltages of memory cells in the memory cell group according to the threshold levels to store the plurality of data groups; and reading the memory cell group to retrieve memory data based on threshold voltages of memory cells in the memory cell group, the memory data corresponding to the plurality of data groups;

determining that a first codeword in the memory data corresponding to a third group fails to decode; and computing a version of the first codeword from second codewords in the memory data corresponding to the fourth group.

21. A memory sub-system, comprising:
a processing device; and
at least one memory device, the memory device having a memory cell group formed on an integrated circuit die, the memory device configured to program threshold levels of the memory cell group at a predetermined number of bits per memory cell according to a Gray code to represent bit values stored in a memory cell by a threshold level of the memory cell;

wherein the processing device is configured to generate a plurality of data groups from first groups of data bits, the first groups of data bits having less than the predetermined number of bits per memory cell for the memory cell group, the plurality of the data groups having the predetermined number of bits per memory cell for the memory cell group, wherein the data groups provided to the memory device for storing is a plurality of first data groups;

wherein the processing device is configured to provide the plurality of data groups to the memory device to store one bit from each of the plurality of data groups in each memory cell in the memory cell group;

wherein the processing device is configured to receive a plurality of second data groups from the memory device reading the memory cell groups; and in response to a first codeword in the second data groups failing to decode based on an error correction code; and wherein the processing device is further configured to compute a replacement of the first codeword from second codewords, each of the second codewords being from a different one of the second data groups.

* * * * *